(12) United States Patent
Onizuka et al.

(10) Patent No.: US 8,907,723 B2
(45) Date of Patent: Dec. 9, 2014

(54) POWER AMPLIFIER AND POWER TRANSMISSION APPARATUS

(71) Applicant: Kabushiki Kaisha Toshiba, Tokyo (JP)

(72) Inventors: Kohei Onizuka, Tokyo (JP); Shigehito Saigusa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/161,176

(22) Filed: Jan. 22, 2014

(65) Prior Publication Data

US 2014/0132356 A1     May 15, 2014

Related U.S. Application Data

(63) Continuation of application No. PCT/JP2012/066831, filed on Jun. 26, 2012.

(30) Foreign Application Priority Data

Aug. 9, 2011    (JP) .................... 2011-173734

(51) Int. Cl.
     *H03F 3/217*        (2006.01)

(52) U.S. Cl.
     USPC ................ 330/251; 330/305; 330/207 A

(58) Field of Classification Search
     USPC ............... 330/251, 305, 207 A, 252
     See application file for complete search history.

(56) References Cited

U.S. PATENT DOCUMENTS

| | | | | |
|---|---|---|---|---|
| 4,318,164 A | * | 3/1982 | Onodera et al. | ............ 363/21.1 |
| 4,607,323 A | * | 8/1986 | Sokal et al. | .................. 363/97 |
| 5,187,580 A | * | 2/1993 | Porter et al. | ............. 330/207 A |
| 5,339,041 A | | 8/1994 | Nitardy | |
| 5,404,113 A | | 4/1995 | Nitardy | |
| 7,119,311 B2 | | 10/2006 | Makoto | |
| 7,474,149 B2 | * | 1/2009 | Snelgrove et al. | ............ 330/136 |
| 8,344,801 B2 | * | 1/2013 | Owen et al. | .................. 330/251 |
| 2011/0057726 A1 | | 3/2011 | Jos | |
| 2012/0235509 A1 | | 9/2012 | Ueno et al. | |
| 2013/0043951 A1 | * | 2/2013 | Irish et al. | .................... 330/285 |

FOREIGN PATENT DOCUMENTS

| | | |
|---|---|---|
| JP | 2005-168246 A | 6/2005 |
| WO | WO 2011/061821 A1 | 5/2011 |

OTHER PUBLICATIONS

International Search Report (ISR) and International Preliminary Report on Patentability (IPRP) dated Oct. 30, 2012 (in English) issued in counterpart International Application No. PCT/JP2012/066831.

Collins et al., "Computer control of a Class-E Amplifier", International Journal of Electronics, vol. 64, No. 3, Mar. 1, 1988, pp. 493-506 (in English).

(Continued)

*Primary Examiner* — Patrick Nguyen

(74) *Attorney, Agent, or Firm* — Holtz, Holtz, Goodman & Chick PC

(57) ABSTRACT

According to an embodiment, a power amplifier includes a variable passive element and a comparator. The variable passive element is connected directly or indirectly to a first terminal of a switch element and serves to increase or reduce a resonant frequency of the amplifier. The comparator compares a voltage of interest with a reference voltage and outputs a control voltage for the variable passive element based on a difference between the voltage of interest and the reference voltage.

12 Claims, 4 Drawing Sheets

(56) References Cited

OTHER PUBLICATIONS

Singhal et al., "A Zero-Voltage-Switching Contour-Based Power Amplifier With Minimal Efficiency Degradation Under Back-Off", IEEE Transactions on Microwave Theory and Techniques, vol. 59, No. 6, Jun. 1, 2011, pp. 1589-1598 (in English).

Suetsugu et al., "ZVS Condition Predicting Sensor for Class E Amplifier", IEEE Transactions on Circuits and Systems—1: Fundamental Theory and Applications, vol. 50, No. 6, Jun. 1, 2003, pp. 763-769 (in English).

Steve Hung-Lung Tu, "A Power-Adaptive CMOS Class E RF Tuned Power Amplifier for Wireless Communications", 2003 SOC Conference, IEEE, Sep. 17, 2003, pp. 365-368 (in English).

Philip R. Troyk et al: "Closed-Loop Class E Transcutaneous Power and Data Link for MicroImplants", IEEE Transactions on Biomedical Engineering, vol. 39, No. 6, Jun. 1992, pp. 589-599 (in English).

Steve C. Cripps, "RF Power Amplifiers for Wireless Communications", Second Edition, pp. 182-193 (in English).

U.S. Appl. No. 13/342,381, First Named Inventor: Kohei Onizuka, Title: "Wireless Power Transmitter", Filed: Jan. 3, 2012.

* cited by examiner

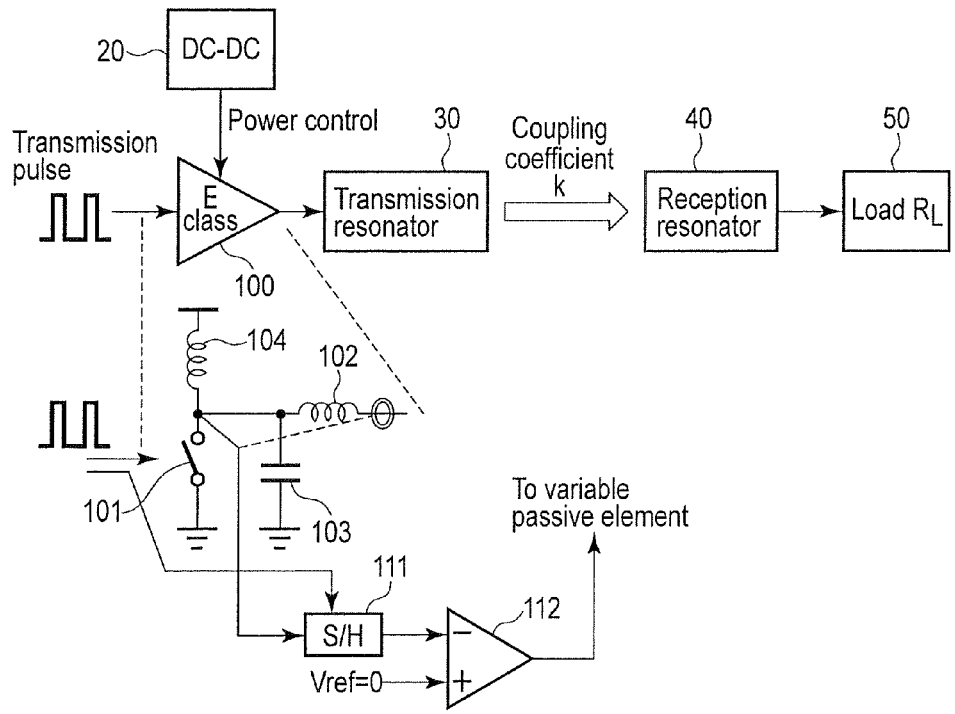
F I G. 1
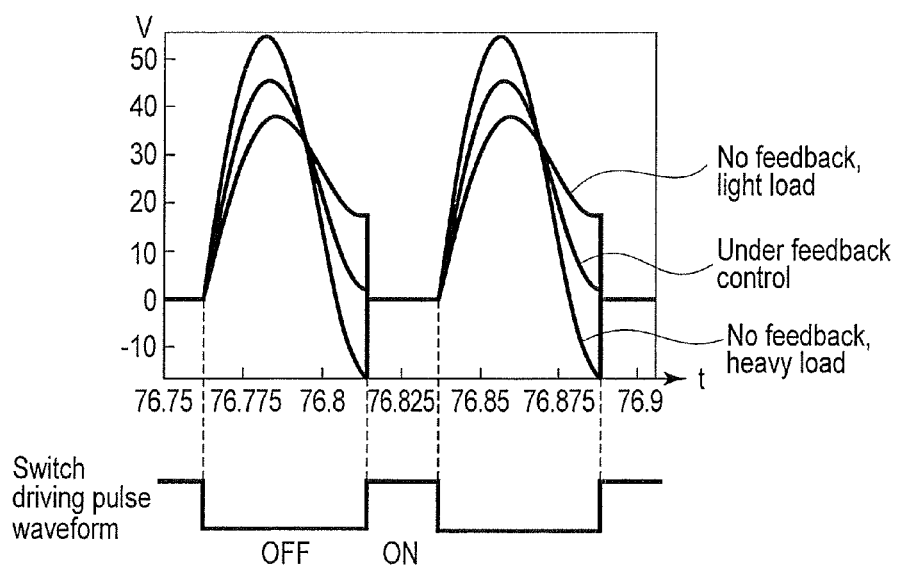
F I G. 2

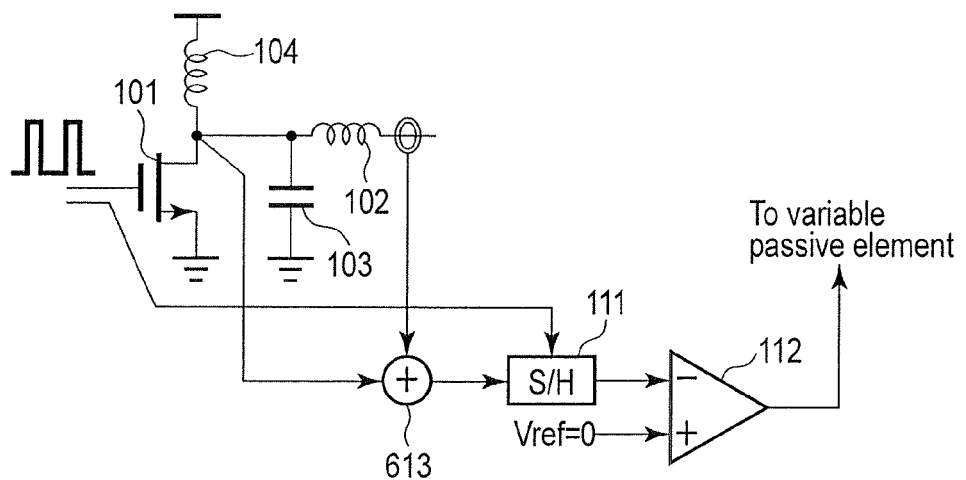
F I G. 7
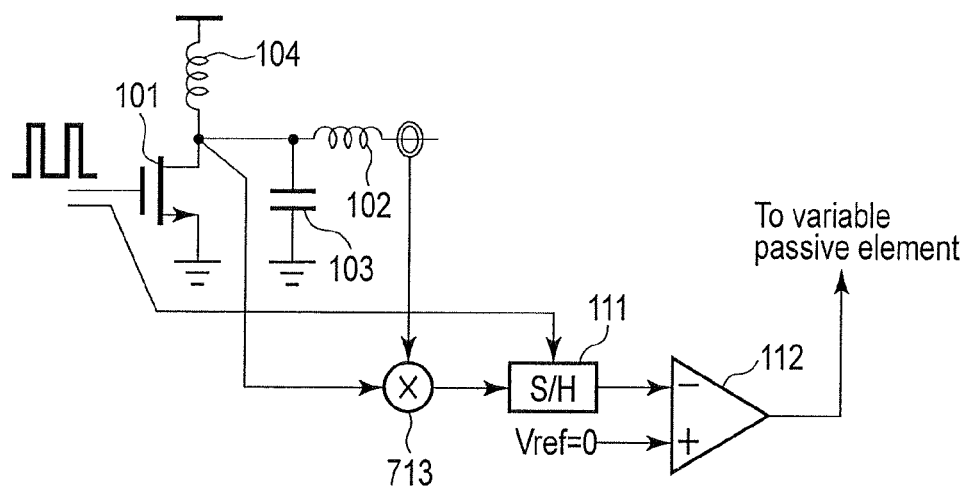
F I G. 8

US 8,907,723 B2

POWER AMPLIFIER AND POWER TRANSMISSION APPARATUS

CROSS-REFERENCE TO RELATED APPLICATIONS

This application is a Continuation Application of PCT Application No. PCT/JP2012/066831, filed Jun. 26, 2012 and based upon and claiming the benefit of priority from prior Japanese Patent Application No. 2011-173734, filed Aug. 9, 2011, the entire contents of all of which are incorporated herein by reference.

FIELD

Embodiments relate to a class E amplifier.

BACKGROUND

Various types of power amplifiers have been proposed. A class E power amplifier is incorporated in, for example, a power transmission apparatus in a wireless power transmission system to amplify power for transmission. In general, the class E power amplifier achieves high amplification efficiency through an operation called zero-cross switching. The zero-cross switching operation is implemented by turning on and off a switch element provided in the class E power amplifier according to a switching frequency.

When the class E power amplifier is incorporated in the power transmission apparatus, power transmission conditions are not always constant. For example, the distance between the power transmission apparatus and a power reception apparatus may vary, an obstacle may be present near the power transmission and reception apparatuses, or the load impedance of the power reception apparatus may vary. The switching frequency suitable for the zero-cross switching operation varies depending on a variation in the transmission conditions. That is, the variation in transmission conditions may disrupt the zero-cross switching operation, thus increasing a conduction loss in the switching element and reducing amplification efficiency.

To suppress the decrease in the amplification efficiency, a technique to correct the switching frequency depending on the variation in the transmission conditions is expected to be used. However, a power transmission frequency needs to be variable in order to allow such a technique to be applied. Thus, such a technique cannot be applied in a situation where the power transmission frequency is not allowed to be changed because of legal restrictions or the like. Therefore, avoiding the decrease in the amplification efficiency is difficult.

BRIEF DESCRIPTION OF THE DRAWINGS

FIG. 1 is a block diagram illustrating a wireless power transmission system including a power amplifier according to a first embodiment;

FIG. 2 is a graph illustrating the effects of the power amplifier in FIG. 1;

FIG. 7 is a diagram illustrating a power amplifier according to a sixth embodiment; and FIG. 8 is a diagram illustrating a power amplifier according to a seventh embodiment.

DETAILED DESCRIPTION

Figure 3:
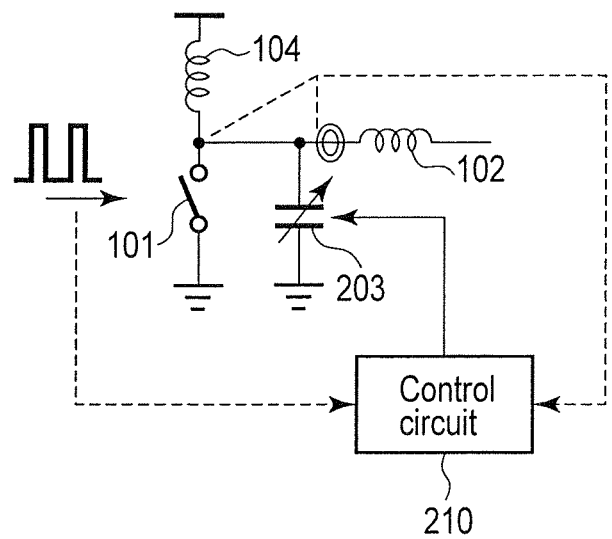
FIG. 3 is a diagram illustrating a power amplifier according to a second embodiment.

Embodiments will be described below with reference to the drawings.

According to an embodiment, a power amplifier includes a switch element, a variable passive element, a sampler and a comparator. The switch element includes a first terminal, a second terminal, and a control terminal, shorts a circuit between the first terminal and the second terminal in response to a first edge of an input drive pulse supplied to the control terminal, and opens the circuit between the first terminal and the second terminal in response to a second edge appearing in the input drive pulse alternately with the first edge. The variable passive element is connected directly or indirectly to the first terminal and serves to increase or reduce a resonant frequency of the amplifier. The sampler samples a voltage of interest. The voltage of interest is based on at least one of a first voltage between the first terminal and the second terminal and a second voltage obtained by subjecting an output current from the amplifier to a current-voltage conversion. The comparator compares the voltage of interest with a reference voltage and outputs a control voltage for the variable passive element based on a difference between the voltage of interest and the reference voltage.

In the description below, components that are identical or similar to those which have already been described are denoted by identical or similar reference numbers, and duplicate descriptions are basically omitted.

(First Embodiment)

As shown in FIG. 1, a power amplifier 100 according to a first embodiment is incorporated in a wireless power transmission system. The wireless power transmission system includes a DC-DC converter 20, a power amplifier 100, a transmission resonator 30, a reception resonator 40, and a load 50. The DC-DC converter 20, the power amplifier 100, and the transmission resonator 30 are incorporated in a power transmission apparatus. The reception resonator 40 and the load 50 are incorporated in a power reception apparatus.

The DC-DC converter 20 converts a power supply voltage for the power amplifier 100 into a desired value. Transmission power described below is controlled through the conversion of the power supply voltage. The power amplifier 100 receives an input drive pulse (which may also be referred to as a transmission pulse) to generate transmission power that is equal to the input drive pulse in frequency. The transmission resonator 30 couples magnetically to the reception resonator 40 based on a given coupling coefficient (=k) to transmit power. The transmission resonator 30 may be implemented by a resonant circuit included in the power amplifier 100.

The reception resonator 40 receives power from the transmission resonator 30 and supplies the power to the load 50. Examples of the load 50 include a circuit that mainly consumes or temporarily stores the power (for example, a load circuit in a reception apparatus or a battery), a rectifier, and a voltage converter.

For example, when an impedance component ($=R_L$) of the load 50 varies, the coupling coefficient k changes, or an obstacle is interposed between the transmission resonator 30 and the reception resonator 40, the resonant frequency of the power amplifier 100 varies and a zero-cross switching operation is prevented.

More specifically, the power amplifier 100 includes a switch element 101, an inductor 102, a capacitor 103, a choke 104, a sampler 111, and a voltage comparator 112.

The power amplifier 100 is typically a class E power amplifier but is not limited to this. For example, the power amplifier 100 may be another type of power amplifier that can perform a zero-cross switching operation. Furthermore, the connection relationship among the elements shown in FIG. 1 is illustrative, and other elements not shown in FIG. 1 may be present. That is, the connection between the elements may mean a direct connection or an indirect connection.

The switch element 101 includes a first terminal, a second terminal, and a control terminal. The switch element 101 can be implemented by, for example, a metal-oxide semiconductor (MOS) transistor or a bipolar transistor. The first terminal of the switch element 101 is connected to a first terminal of the inductor 102, a first terminal of the capacitor 103, and a first terminal of the choke 104. The second terminal of the switch element 101 is grounded.

A control terminal of the switch element 101 receives the above-described input drive pulse. In the input drive pulse, a rising or falling edge (first edge) and a falling or rising edge (second edge) alternately appear. The switch element 101 shorts the circuit between the first terminal and the second terminal in response to the first edge (that is, the switch element 101 is turned on). The switch element 101 opens the circuit between the first terminal and the second terminal in response to the second edge (that is, the switch element 101 is turned off). If the voltage between the first terminal and second terminal of the switch element 101 is equal to zero when the first edge appears, the zero-cross switching operation is normally performed.

An output current from the power amplifier 100 flows through the inductor 102. The first terminal of the inductor 102 is connected to the first terminal of the switch element 101, the first terminal of the capacitor 103, and the first terminal of the choke 104. Furthermore, a second terminal of the inductor 102 is connected to an output terminal (not shown in the drawings) of the power amplifier 100. The inductance of the inductor 102 serves to increase and reduce the resonant frequency of the power amplifier 100.

The capacitor 103 is connected in parallel with the switch element 101. That is, the first terminal of the capacitor 103 is connected to the first terminal of the switch element 101, the first terminal of the inductor 102, and the first terminal of the choke 104. Furthermore, a second terminal of the capacitor 103 is grounded. The capacitance of the capacitor 103 serves to increase and reduce the resonant frequency of the power amplifier 100.

The first terminal of the choke 104 is connected to the first terminal of the switch element 101, the first terminal of the inductor 102, and the first terminal of the capacitor 103. Furthermore, a second terminal of the choke 104 is connected to a power source side (that is, an output terminal of the DC-DC converter 20).

In response to the first edge of the input drive pulse, the sampler 111 samples a voltage of interest. The voltage of interest is based on one of a first voltage between the first terminal and second terminal of the switch element 101 and a second voltage obtained by subjecting an output current from the power amplifier 100 (that is, a current passing through the inductor 102) to a current-voltage conversion. The values of the first voltage and the second voltage are detected, for example, by a detection circuit (not shown in the drawings). The sampler 111 may be a sample-and-hold circuit.

The voltage comparator 112 compares the voltage of interest with a reference voltage (=Vref) and outputs a control voltage corresponding to the difference between the voltage of interest and the reference voltage. The reference voltage is typically equal to zero.

The control voltage is provided to a variable passive element to control the inductance or capacitance of the variable passive element. The variable passive element may be the inductor 102, the capacitor 103, a passive element not shown in the drawings, or a combination thereof. The inductance or capacitance of the variable passive element is feedback controlled so that the difference between the voltage of interest and the reference voltage approaches zero. As the difference approaches zero, the operation of the power amplifier 100 becomes more similar to zero-cross switching. That is, the amplification efficiency of the power amplifier 100 is improved. Furthermore, even if the resonant frequency of the power amplifier 100 varies due to a variation in the impedance component ($=R_L$) of the load 50, a change in coupling coefficient k, or interposition of an obstacle between the transmission resonator 30 and the reception resonator 40, the operation of the power amplifier 100 is normalized in a stepwise fashion through the feedback control.

FIG. 2 shows the results of simulation of the operation of the power amplifier 100. In this simulation, for comparison with the operation of the power amplifier 100, an operation performed by the power amplifier 100 when the power amplifier 100 is not subjected to the feedback control was also simulated. In FIG. 2, the axis of ordinate indicates the voltage between the first terminal and second terminal of the switch element 101. The axis of abscissas indicates time. That is, FIG. 2 shows a temporal variation in the voltage between the first terminal and second terminal of the switch element 101.

The power amplifier 100 provides similar waveforms regardless of an increase and a decrease in the impedance component ($=R_L$) and coupling coefficient ($=k$) of the load 50. In FIG. 2, such a waveform is labeled as "under feedback control". The waveform indicates that when the first edge (in the present example, the rising edge) appears, a voltage generated between the first terminal and second terminal of the switch element 101 is substantially equal to zero. Thus, the power amplifier 100 normally performs a zero-cross switching operation to achieve a high amplification efficiency.

When the feedback control was not performed, the waveform varied in connection with a variation in the impedance component ($=R_L$) or coupling coefficient ($=k$) of the load 50. When the real part of the impedance component ($=R_L$) or the coupling coefficient ($=k$) of the load 50 was large, the waveform labeled as "no feedback and light load" was obtained. On the other hand, when the real part of the impedance component ($=R_L$) or the coupling coefficient ($=k$) of the load 50 was small, the waveform labeled as "no feedback and heavy load" was obtained. In either case, when the first edge (in the present example, the rising edge) appears, the voltage between the first terminal and the second terminal of the switch element 101 has a positive or negative value. When the switch element 101 is turned on, a voltage is applied to between the first terminal and the second terminal. Thus, one or both of magnetic energy stored in the inductor 102 and charge energy stored in the capacitor is consumed by the switch element 101, reducing the amplification efficiency of the power amplifier 100.

As described above, the power amplifier according to the first embodiment samples the voltage of interest based on one of the first voltage between the first terminal and second terminal of the switch element and the second voltage obtained by subjecting the output current to a current-voltage conversion, when the first edge appears. The power amplifier then feedback controls the variable passive element according to the difference between the voltage of interest and the reference voltage. Thus, even with a variation in transmission conditions, the operation of the power amplifier becomes similar to the zero-cross switching operation in a stepwise fashion. This enables a decrease in amplification efficiency to be suppressed without the need to correct the switching frequency.

(Second Embodiment)

As shown in FIG. 3, a power amplifier according to a second embodiment includes a switch element 101, an inductor 102, a variable capacitor 203, a choke 104, and a control circuit 210.

The control circuit 210 corresponds to, for example, a combination of the sampler 111 and voltage comparator 112 described above. The control circuit 210 generates a control voltage for the variable capacitor 203 so that the difference between a voltage of interest and a reference voltage approaches zero; the voltage of interest is based on at least one of the first voltage and the second voltage obtained when the above-described first edge appears.

The variable capacitor 203 has a capacitance varying depending on the control voltage from the control circuit 210. The capacitance of the variable capacitor 203 serves to increase and reduce the resonant frequency of the power amplifier in FIG. 3. The capacitance of the variable capacitor 203 is feedback controlled so that the difference between the voltage of interest and the reference voltage obtained when the first edge appears approaches zero. Specifically, the capacitance of the variable capacitor 203 decreases in accordance with the control voltage if the difference is positive and increases in accordance with the control voltage if the difference is negative.

The variable capacitor 203 is connected in parallel with the switch element 101. A first terminal of the variable capacitor 203 is connected to a first terminal of the switch element 101, a first terminal of the inductor 102, and a first terminal of the choke 104. Furthermore, a second terminal of the variable capacitor 203 is grounded.

As described above, the power amplifier according to the second embodiment samples the voltage of interest based on one of the first voltage between the first terminal and second terminal of the switch element and the second voltage obtained by subjecting the output current to a current-voltage conversion, when the first edge appears. The power amplifier then feedback controls the variable capacitor according to the difference between the voltage of interest and the reference voltage. Thus, even with a variation in the transmission conditions, the operation of the power amplifier becomes similar to the zero-cross switching operation in a stepwise fashion. This enables a decrease in the amplification efficiency to be suppressed without the need to correct the switching frequency. Furthermore, the control target of the present power amplifier is limited to the variable capacitor. Hence, the present embodiment enables the control to be simplified compared with a case where a plurality of elements need to be controlled.

(Third Embodiment)

Figure 4:
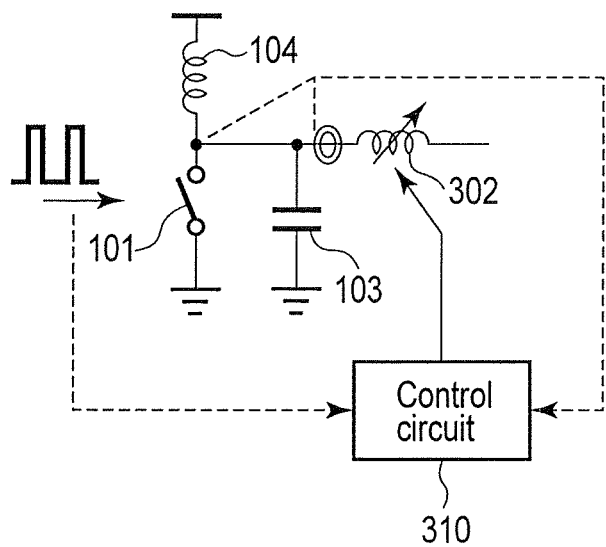
FIG. 4 is a diagram illustrating a power amplifier according to a third embodiment.

As shown in FIG. 4, a power amplifier according to a third embodiment includes a switch element 101, a variable inductor 302, a capacitor 103, a choke 104, and a control circuit 310.

The control circuit 310 corresponds to, for example, a combination of the sampler 111 and voltage comparator 112 described above. The control circuit 310 generates a control voltage for the variable inductor 302 so that the difference between a voltage of interest and a reference voltage approaches zero; the voltage of interest is based on at least one of the first voltage and the second voltage obtained when the above-described first edge appears.

The variable inductor 302 has an inductance varying depending on the control voltage from the control circuit 310. The inductance of the variable inductor 302 serves to increase and reduce the resonant frequency of the power amplifier in FIG. 4. The inductance of the variable inductor 302 is feedback controlled so that the difference between the voltage of interest and the reference voltage obtained when the first edge appears approaches zero. Specifically, the inductance of the variable inductor 302 decreases in accordance with the control voltage if the difference is positive and increases in accordance with the control voltage if the difference is negative.

An output current from the power amplifier in FIG. 4 flows through the variable inductor 302. A first terminal of the variable inductor 302 is connected to a first terminal of the switch element 101, a first terminal of the capacitor 103, and a first terminal of the choke 104. Furthermore, a second terminal of the variable inductor 302 is connected to an output terminal (not shown in the drawings) of the power amplifier in FIG. 4.

As described above, the power amplifier according to the third embodiment samples the voltage of interest based on one of the first voltage between the first terminal and second terminal of the switch element and the second voltage obtained by subjecting the output current to a current-voltage conversion, when the first edge appears. The power amplifier then feedback controls the variable inductor according to the difference between the voltage of interest and the reference voltage. Thus, even with a variation in the transmission conditions, the operation of the power amplifier becomes similar to the zero-cross switching operation in a stepwise fashion. This enables a decrease in the amplification efficiency to be suppressed without the need to correct the switching frequency. Furthermore, the control target of the present power amplifier is limited to the variable inductor. Hence, the present embodiment enables the control to be simplified compared with a case where a plurality of elements need to be controlled.

(Fourth Embodiment)

Figure 5:
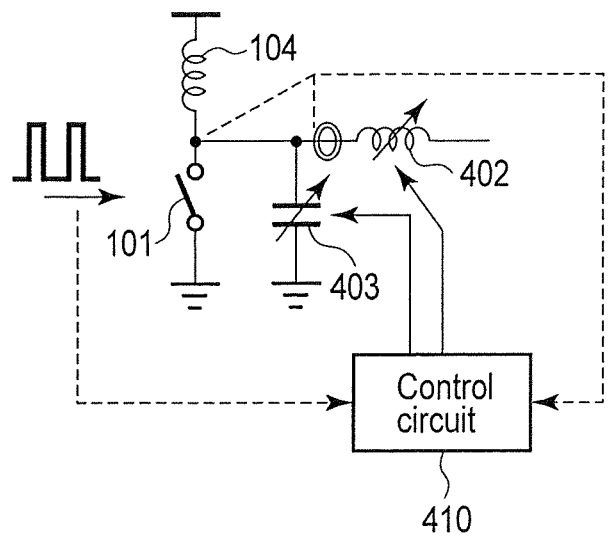
FIG. 5 is a diagram illustrating a power amplifier according to a fourth embodiment.

As shown in FIG. 5, a power amplifier according to a fourth embodiment includes a switch element 101, a variable inductor 402, a variable capacitor 403, a choke 104, and a control circuit 410.

The variable inductor 402 has an inductance varying depending on a control voltage from the control circuit 410. The inductance of the variable inductor 402 serves to increase and reduce the resonant frequency of the power amplifier in FIG. 5. That is, the inductance of the variable inductor 402 is feedback controlled. Such control will be described below in detail.

An output current from the power amplifier in FIG. 5 flows through the variable inductor 402. A first terminal of the variable inductor 402 is connected to a first terminal of the switch element 101, a first terminal of the variable capacitor 403, and a first terminal of the choke 104. Furthermore, a second terminal of the variable inductor 402 is connected to an output terminal (not shown in the drawings) of the power amplifier in FIG. 5.

The variable capacitor 403 has a capacitance varying depending on the control voltage from the control circuit 410. The capacitance of the variable capacitor 403 serves to increase and reduce the resonant frequency of the power amplifier in FIG. 5. The capacitance of the variable capacitor 403 is feedback controlled by the control voltage. This control will be described below in detail.

The variable capacitor 403 is connected in parallel with the switch element 101. That is, a first terminal of the variable capacitor 403 is connected to a first terminal of the switch element 101, a first terminal of the variable inductor 402, and a first terminal of the choke 104. Furthermore, a second terminal of the variable capacitor 403 is grounded.

The control circuit 410 corresponds to, for example, a combination of the sampler 111 and voltage comparator 112 described above. The control circuit 410 generates a control voltage for the variable inductor 402 and the variable capacitor 403. Specifically, the control voltage from the control circuit 410 controls the variable inductor 402 and the variable capacitor 403 so that $$LC = \frac{f(\theta)}{\omega^2} \quad (1)$$

In Expression (1), L represents an inductance related to the resonance of the power amplifier in FIG. 5. At least the inductance of the variable inductor 402 is reflected in L. In Expression (1), C represents a capacitance related to the resonance of the power amplifier in FIG. 5. At least the capacitance of the variable capacitor 403 is reflected in C. In Expression (1), ω represents the angular frequency of an input drive pulse supplied to the switch element 101, θ is equal to 2πD, and D represents the duty ratio of the input drive pulse. f(θ) is given by:

$$f(\theta) = \frac{2(2\pi - \theta)^3 + 4\sin\theta - 2\sin 2\theta + (2\pi - \theta)\{4\cos\theta - 4\cos 2\theta + (2\pi - \theta)(4\sin\theta + \sin 2\theta)\}}{4\pi\{2 + (-2\pi + \theta)^2 - 2\cos\theta + \sin\theta(4\pi - 2\theta)\}}$$

A process for deriving this expression can be understood with reference to Non-Patent Document 2 and will thus not be described in detail.

As described above, the power amplifier according to the fourth embodiment samples the voltage of interest based on one of the first voltage between the first terminal and second terminal of the switch element and the second voltage obtained by subjecting the output current to a current-voltage conversion, when the first edge appears. The power amplifier then feedback controls the variable inductor and the variable capacitor according to the difference between the voltage of interest and the reference voltage. This control allows Expression (1) to be stably met. Thus, even with a variation in the transmission conditions, the operation of the power amplifier becomes similar to the zero-cross switching operation in a stepwise fashion. This enables a decrease in the amplification efficiency to be suppressed without the need to correct the switching frequency.

The present embodiment adopts the variable capacitor and the variable inductor. However, one of the variable inductor and the variable capacitor may be replaced with a normal inductor or capacitor. In such a case, the variable capacitor or the variable inductor is controlled so as to meet Expression (1) shown above.

(Fifth Embodiment)

Figure 6:
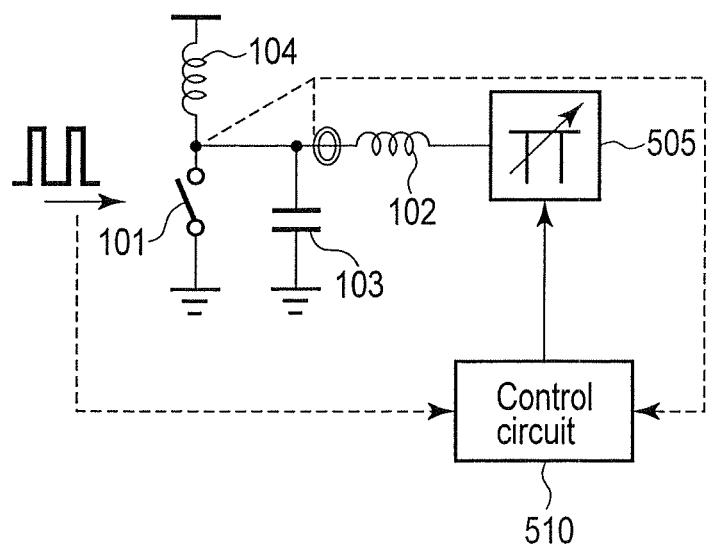
FIG. 6 is a diagram illustrating a power amplifier according to a fifth embodiment.

As shown in FIG. 6, a power amplifier according to a fifth embodiment includes a switch element 101, an inductor 102, a capacitor 103, a choke 104, an impedance converter 505, and a control circuit 510.

The control circuit 510 corresponds to, for example, a combination of the sampler 111 and voltage comparator 112 described above. The control circuit 510 generates a control voltage for the impedance converter 505 so that the difference between a voltage of interest and a reference voltage approaches zero; the voltage of interest is based on at least one of the first voltage and the second voltage obtained when the above-described first edge appears.

The impedance converter 505 has an input impedance varying discretely or continuously depending on the control voltage from the control circuit 510. The impedance converter 505 is connected to a second terminal of the inductor 102. The input impedance of the impedance converter 505 serves to increase and reduce the resonant frequency of the power amplifier in FIG. 6. That is, the input impedance of the impedance converter 505 is feedback controlled so that the difference between the voltage of interest and the reference voltage obtained when the first edge appears approaches zero. Specifically, the imaginary part of the impedance of the impedance converter 505 decreases in accordance with the control voltage if the difference is positive and increases in accordance with the control voltage if the difference is negative.

As described above, the power amplifier according to the fifth embodiment samples the voltage of interest based on one of the first voltage between the first terminal and second terminal of the switch element and the second voltage obtained by subjecting the output current to a current-voltage conversion, when the first edge appears. The power amplifier then feedback controls the impedance converter according to the difference between the voltage of interest and the reference voltage. Thus, even with a variation in the transmission conditions, the operation of the power amplifier becomes similar to the zero-cross switching operation in a stepwise fashion. This enables a decrease in the amplification efficiency to be suppressed without the need to correct the switching frequency. Furthermore, the control target of the present power amplifier is limited to the impedance converter. Hence, the present embodiment enables the control to be simplified compared with a case where a plurality of elements need to be controlled.

(Sixth Embodiment)

As shown in FIG. 7, a power amplifier according to a sixth embodiment includes a switch element 101, an inductor 102, a capacitor 103, a choke 104, a sampler 111, a voltage comparator 112, and an adder 613.

The adder 613 adds the first voltage and the second voltage together to obtain a third voltage. The adder 613 outputs the third voltage to the sampler 111. In response to the first edge, the sampler 111 samples a voltage of interest. The voltage of interest is based on the third voltage.

As described above, the power amplifier according to the sixth embodiment samples the voltage of interest based on the third voltage that is the sum of the first voltage and the second voltage when the first edge appears. The power amplifier then feedback controls the variable passive element according to the difference between the voltage of interest and the reference voltage. Thus, even with a variation in the transmission conditions, the operation of the power amplifier becomes similar to the zero-cross switching operation in a stepwise fashion. This enables a decrease in the amplification efficiency to be suppressed without the need to correct the switching frequency. According to the power amplifier, even if the accuracy when one of the first voltage and the second voltage is detected decreases as a result of disturbance or an error in a detection circuit, the other voltage is reflected in the voltage of interest, enabling the appropriate feedback control.

(Seventh Embodiment)

As shown in FIG. 8, a power amplifier according to a seventh embodiment includes a switch element 101, an inductor 102, a capacitor 103, a choke 104, a sampler 111, a voltage comparator 112, and a multiplier 713.

The multiplier 713 multiplies the first voltage by the second voltage together to obtain a fourth voltage. The multiplier 713 outputs the fourth voltage to the sampler 111. In response to the first edge, the sampler 111 samples a voltage of interest. The voltage of interest is based on the fourth voltage.

As described above, the power amplifier according to the seventh embodiment samples the voltage of interest based on the fourth voltage that is the product of the first voltage and the second voltage when the first edge appears. The power amplifier then feedback controls the variable passive element according to the difference between the voltage of interest and the reference voltage. Thus, even with a variation in the transmission conditions, the operation of the power amplifier becomes similar to the zero-cross switching operation in a stepwise fashion. This enables a decrease in the amplification efficiency to be suppressed without the need to correct the switching frequency. According to the power amplifier, even if the accuracy when one of the first voltage and the second voltage is detected decreases as a result of disturbance or an error in a detection circuit, the other voltage is reflected in the voltage of interest, enabling the appropriate feedback control.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A power amplifier comprising:
    a switch element configured to comprise a first terminal, a second terminal, and a control terminal, to short a circuit between the first terminal and the second terminal in response to a first edge of an input drive pulse supplied to the control terminal, and to open the circuit between the first terminal and the second terminal in response to a second edge appearing in the input drive pulse alternately with the first edge;
    a variable passive element configured to be connected directly or indirectly to the first terminal and to serve to increase or reduce a resonant frequency of the amplifier;
    a sampler configured to sample a voltage of interest in response to the first edge, the voltage of interest being based on at least one of a first voltage between the first terminal and the second terminal and a second voltage obtained by subjecting an output current from the amplifier to a current-voltage conversion; and
    a comparator configured to compare the voltage of interest with a reference voltage and to output a control voltage for the variable passive element based on a difference between the voltage of interest and the reference voltage.

2. The amplifier according to claim 1, wherein the variable passive element comprises a variable capacitor connected in parallel with the switch element, and
    a capacitance of the variable capacitor decreases in accordance with the control voltage if the difference is positive and increases in accordance with the control voltage if the difference is negative.

3. The amplifier according to claim 1, wherein the variable passive element comprises a variable inductor connected directly or indirectly to the first terminal in such a manner that an output current from the amplifier passes through the variable inductor, and
    an inductance of the variable inductor decreases in accordance with the control voltage if the difference is positive and increases in accordance with the control voltage if the difference is negative.

4. The amplifier according to claim 1, wherein the variable passive element comprises at least one of a variable capacitor connected in parallel with the switch element and a variable inductor connected directly or indirectly to the first terminal in such a manner that an output current from the amplifier passes through the variable inductor, and
    at least one of a capacitance of the variable capacitor and an inductance of the variable inductor is controlled by the control voltage so that $$LC = \frac{f(\theta)}{\omega^2},$$

where L represents an inductance related to a resonance of the amplifier,
C represents a capacitance related to the resonance of the amplifier,
ω represents an angular frequency of the input drive pulse,
θ represents a value obtained by multiplying a duty ratio of the input drive pulse by 2π, and
f(θ) is given by:

$$f(\theta) = \frac{2(2\pi - \theta)^3 + 4\sin\theta - 2\sin 2\theta + (2\pi - \theta)\{4\cos\theta - 4\cos 2\theta + (2\pi - \theta)(4\sin\theta + \sin 2\theta)\}}{4\pi\{2 + (-2\pi + \theta)^2 - 2\cos\theta + \sin\theta(4\pi - 2\theta)\}}.$$

5. The amplifier according to claim 1, wherein the variable passive element comprises an impedance converter connected indirectly to the first terminal in such a manner that an output current from the amplifier passes through the impedance converter, and
    an imaginary part of an input impedance of the impedance converter decreases in accordance with the control voltage if the difference is positive and increases in accordance with the control voltage if the difference is negative.

6. The amplifier according to claim 1, further comprising an adder configured to add the first voltage and the second voltage together to obtain a third voltage, and
    wherein the sampler samples the third voltage as the voltage of interest.

7. The amplifier according to claim 1, further comprising a multiplier configured to multiply the first voltage by the second voltage to obtain a fourth voltage, and
    wherein the sampler samples the fourth voltage as the voltage of interest.

8. A power transmission apparatus comprising:
    the amplifier according to claim 1, which amplifies transmission power.

9. The amplifier according to claim 1, wherein:
    the variable passive element comprises an impedance converter connected indirectly to the first terminal in such a manner that an output current from the amplifier passes through the impedance converter, and the impedance converter is controlled by the control voltage.

10. The amplifier according to claim 9, wherein the impedance converter is controlled so that the difference between the voltage of interest and the reference voltage approaches zero.

11. The amplifier according to claim 9, wherein the control voltage controls only the impedance converter.

12. A power transmission apparatus comprising:

the amplifier according to claim 5, which amplifies transmission power.

* * * * *